United States Patent
Yu et al.

(10) Patent No.: US 8,399,108 B2
(45) Date of Patent: Mar. 19, 2013

(54) MATERIAL FOR ORGANIC ELECTRO-OPTICAL DEVICE HAVING FLUORENE DERIVATIVE COMPOUND AND ORGANIC ELECTRO-OPTICAL DEVICE INCLUDING THE SAME

(75) Inventors: Eun-Sun Yu, Anyang (KR); Nam-Soo Kim, Bucheon (KR); Young-Hoon Kim, Anyang (KR); Mi-Young Chae, Yongin (KR)

(73) Assignee: Cheil Industries, Inc., Gumi-si, gyeongsangbuk-do (KR)

( * ) Notice: Subject to any disclaimer, the term of this patent is extended or adjusted under 35 U.S.C. 154(b) by 403 days.

(21) Appl. No.: 12/451,748

(22) PCT Filed: May 28, 2008

(86) PCT No.: PCT/KR2008/002995
§ 371 (c)(1),
(2), (4) Date: Apr. 1, 2010

(87) PCT Pub. No.: WO2008/147110
PCT Pub. Date: Apr. 12, 2008

(65) Prior Publication Data
US 2010/0187978 A1   Jul. 29, 2010

(30) Foreign Application Priority Data
May 28, 2007   (KR) .................. 10-2007-0051744

(51) Int. Cl.
*H01L 51/54*   (2006.01)

(52) U.S. Cl. ........ 428/690; 428/917; 313/504; 313/505; 313/506; 257/40; 257/E51.05; 257/E51.032; 257/E51.026; 546/11; 546/79; 546/81; 546/101

(58) Field of Classification Search .................. 428/690, 428/917; 257/40, E51.05, E51.032, E51.026; 313/504, 505, 506; 546/11, 79, 81, 101
See application file for complete search history.

(56) References Cited

U.S. PATENT DOCUMENTS
6,586,120 B2 * 7/2003 Tao et al. ...................... 428/690

FOREIGN PATENT DOCUMENTS
JP   2004-277377 A   10/2004
JP   2007-099765 A    4/2007

* cited by examiner

*Primary Examiner* — Jennifer Chriss
*Assistant Examiner* — Gregory Clark
(74) *Attorney, Agent, or Firm* — Lee & Morse, P.C.

(57) ABSTRACT

The present invention relates to a material for an organic electro-optical device and an organic electro-optical device including the same. More particularly, the present invention relates to a material having thermal stability of a glass transition temperature of 120° C. or more and a thermal decomposition temperature of 450° C. or more, and being capable of providing an organic electro-optical device having high efficiency and a long life-span due to less crystallization and improved amorphous properties in a material for an organic electro-optical device. The material for an organic electro-optical device can be used singularly or as a host material in combination with a dopant, and includes an asymmetric fluorene derivative compound. An organic electro-optical device including the material for an organic electro-optical device is also provided.

11 Claims, 2 Drawing Sheets

MATERIAL FOR ORGANIC ELECTRO-OPTICAL DEVICE HAVING FLUORENE DERIVATIVE COMPOUND AND ORGANIC ELECTRO-OPTICAL DEVICE INCLUDING THE SAME

BACKGROUND OF THE INVENTION (a) Field of the Invention

The present invention relates to a material for an organic electro-optical device and an organic electro-optical device including the same. More particularly, the present invention relates to a material having thermal stability of a glass transition temperature of 120° C. or more and a thermal decomposition temperature of 450° C. or more, and being capable of providing an organic electro-optical device having high efficiency and a long life-span due to less crystallization and improved amorphous properties in a material for an organic electro-optical device, and an organic electro-optical device including the same.

(b) Background of the Invention

An electro-optical device is, in a broad sense, a device for transforming photo energy to electrical energy, and conversely, for transforming electrical energy to photo energy. The electro-optical device may be exemplified by an organic light emitting diode, a solar cell, a transistor, and so on.

Particularly, among these electro-optical devices, an organic light emitting device employing organic light emitting diodes (OLED) has recently drawn attention due to an increase in demand for flat panel displays.

The organic light emitting diode transforms electrical energy into light by applying current to an organic light emitting material. It has a structure in which a functional organic material layer is interposed between an anode and a cathode.

The organic light emitting diode has similar electrical characteristics to those of light emitting diodes (LED) in which holes are injected from an anode and electrons are injected from a cathode, then the holes and electrons move to opposite electrodes and are recombined to form excitons having high energy. The generated excitons generate light having a certain wavelengths while shifting to a ground state.

In 1987, Eastman Kodak, Inc. firstly developed an organic light emitting diode including a low molecular aromatic diamine and aluminum complex as an emission-layer-forming material (Applied Physics Letters. 51, 913, 1987). C. W Tang et al. firstly disclosed a practicable device as an organic light emitting diode in 1987 (Applied Physics Letters, 51 12, 913-915, 1987).

According to the reference, the organic layer has a structure in which a thin film (hole transport layer (HTL)) of a diamine derivative and a thin film of tris(8-hydroxy-quinolate)aluminum ($Alq_3$) are laminated.

Generally, an organic light emitting diode is composed of an anode of a transparent electrode, an organic thin layer of a light emitting region, and a metal electrode (cathode) formed on a glass substrate, in that order. The organic thin layer may include an emission layer, a hole injection layer (HIL), a hole transport layer (HTL), an electron transport layer (ETL), or an electron injection layer (EIL). It may further include an electron inhibition layer or a hole inhibition layer due to the emission characteristics of the emission layer.

When the organic light emitting diode is applied with an electric field, the holes and electrons are injected from the anode and the cathode, respectively. The injected holes and electrons are recombined on the emission layer though the hole transport layer (HTL) and the electron transport layer (ETL) to provide light emitting excitons.

The provided light emitting excitons emit light by transiting to the ground state.

The light emission may be classified as a fluorescent material including singlet excitons and a phosphorescent material including triplet excitons according to light emitting mechanism.

Recently, it is has become known that a phosphorescent light emitting material can be used for a light emitting material of an organic light emitting diode in addition to the fluorescent light emitting material (D. F. O'Brien et al., Applied Physics Letters, 74 3, 442-444, 1999; M. A. Baldo et al., Applied Physics letters, 75 1, 4-6, 1999). Such a phosphorescent material emits lights by transiting the electrons from a ground state to an exited state, non-radiance transiting of a singlet exciton to a triplet exciton through intersystem crossing, and transiting a triplet exciton to a ground state to emit light.

When the triplet exciton is transited, it cannot directly transit to the ground state. Therefore, the electron spin is flipped, and then it is transited to the ground state so that it provides a characteristic of extending the lifetime (emission duration) to more than that of fluorescent emission).

In other words, the duration of fluorescent emission is extremely short at several nanoseconds, but the duration of phosphorescent emission is relatively long such as at several microseconds.

In addition, evaluating quantum mechanically, when holes injected from the anode are recombined with electrons injected from the cathode to provide light emitting excitons, the singlet and the triplet are produced in a ratio of 1:3, in which the triplet light emitting excitons are produced at three times the amount of the singlet light emitting excitons in the organic light emitting diode.

Accordingly, the percentage of the singlet exited state is 25% (the triplet is 75%) in the case of a fluorescent material, so it has limits in luminous efficiency. On the other hand, in the case of a phosphorescent material, it can utilize 75% of the triplet exited state and 25% of the singlet exited state, so theoretically the internal quantum efficiency can reach up to 100%. When a phosphorescent light emitting material is used, it has advantages in an increase in luminous efficiency of around four times that of the fluorescent light emitting material.

In the above-mentioned organic light emitting diode, a light emitting colorant (dopant) may be added in an emission layer (host) in order to increase the efficiency and stability in the emission state.

In this structure, the efficiency and properties of the light emission diodes are dependent on the host material in the emission layer. According to studies regarding the emission layer (host), the organic host material can be exemplified by a material including naphthalene, anthracene, phenanthrene, tetracene, pyrene, benzopyrene, chrysene, pycene, carbazole, fluorene, biphenyl, terphenyl, triphenylene oxide, dihalobi phenyl, trans-stilbene, and 1,4-diphenylbutadiene.

Generally, the host material includes 4,4-N,N-dicarbazole biphenyl (CBP) having a glass transition temperature of 110° C. or less and excessively high symmetry. Thereby, it tends to crystallize and cause problems such as a short and a pixel defect according to results of thermal resistance tests of the devices.

Recently, there have been technical developments in organic electrical light emitting devices. However, luminous efficiency, color purity, and electrical and thermal stability of the device do not approach a satisfactory level. Therefore, it is required to develop phosphorescent light emitting materials having high efficiency, high color purity, and electrical and thermal stability.

SUMMARY OF THE INVENTION

The present invention provides a material for an organic electro-optical device and an organic electro-optical device including the same. More particularly, the present invention relates to a material having thermal stability of a glass transition temperature of 120° C. or more and a thermal decomposition temperature of 450° C. or more, and that is capable of providing an organic electro-optical device having high efficiency and a long life-span due to less crystallization and improved amorphous properties in a material for an organic electro-optical device.

The present invention also provides an organic electro-optical device including the material for an organic electro-optical device.

The embodiments of the present invention are not limited to the above technical purposes, and a person of ordinary skill in the art can understand other technical purposes.

One embodiment of the present invention provides a material for an organic electro-optical device that can be used singularly or as a host material in combination with a dopant, and includes an asymmetric fluorene derivative compound of the following Formula 1.

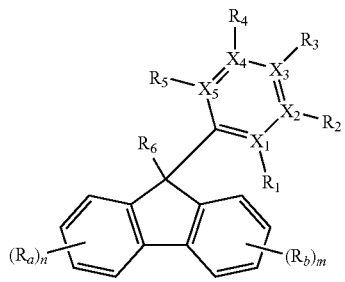

[Chemical Formula 1]

In the above Formula 1:

$X_1$ to $X_5$ are independently carbon or nitrogen;

when $X_1$ to $X_5$ are carbon, $R_1$ to $R_5$ bound to $X_1$ to $X_5$ are substituents bound to the carbon;

when $X_1$ to $X_5$ are nitrogen, $R_1$ to $R_5$ bound to $X_1$ to $X_5$ are unshared electron pairs;

$R_6$ is a substituent;

substituents of $R_1$ to $R_6$ may form a cycle together;

$R_1$ to $R_6$ are independently substituents selected from the group consisting of hydrogen, a substituted or unsubstituted aryl, a substituted or unsubstituted heteroaryl, a substituted or unsubstituted alkyl, a substituted or unsubstituted amino, a substituted or unsubstituted alkoxy, a halogen, a nitro, a substituted or unsubstituted arylene, a substituted or unsubstituted heteroarylene, and a substituted or unsubstituted alkylene;

$R_a$ and $R_b$ are independently selected from the group consisting of hydrogen, a C1 to C10 alkyl, and a C1 to C10 alkoxy; and n and m are independently integers ranging from 1 to 4.

Another embodiment of the present invention provides an organic electro-optical device including an organic thin layer that includes the material for an organic electro-optical device.

In the present specification, when specific definition is not provided, "an aryl" refers to an aryl having a carbon number of 6 or more and preferably a carbon number of 6 to 60, "a heteroaryl" refers to a heteroaryl having a carbon number of 2 or more and preferably a carbon number of 2 to 60, "an alkyl" refers to an alkyl having a carbon number of 1 or more and preferably a carbon number 1 to 60, "an amino" refers to an amino having a carbon number of 2 or more and preferably a carbon number of 2 to 60, "an alkoxy" refers to an alkoxy having a carbon number of 1 or more, and preferably a carbon number of 1 to 60, "an arylene" refers to an arylene having a carbon number of 6 or more and preferably a carbon number of 6 to 60, "a heteroarylene" refers to a heteroarylene having a carbon number of 2 or more and preferably a carbon number of 2 to 60, and "an alkylene" refers to an alkylene having a carbon number of 1 or more and preferably a carbon number of 1 to 60.

In the present specification, the substituted aryl, substituted heteroaryl, substituted alkyl, substituted amino, substituted alkoxy, substituted arylene, substituted heteroarylene, and substituted alkylene refer to one substituted with at least a substituent selected from the group consisting of an aryl, a heteroaryl, an alkyl, an amino, an alkoxy, a halogen (F, Cl, Br, or I), and a nitro.

Hereinafter, other embodiments of the present invention will be described in detail.

The material for an organic electro-optical device is capable of providing an organic electro-optical device having high efficiency and a long life-span due to thermal stability, less crystallization, and improved amorphous properties.

DETAILED DESCRIPTION OF THE EMBODIMENTS

Figure 1:
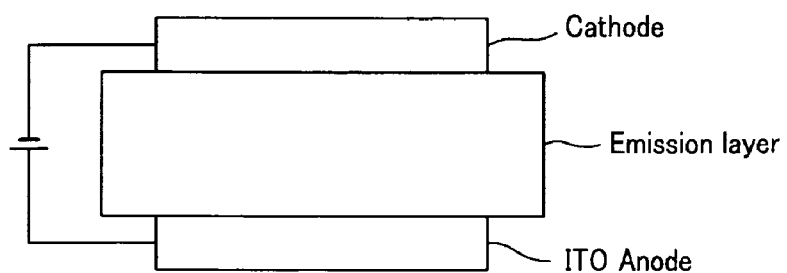
FIGS. 1 to 5 are cross-sectional views showing organic electro-optical devices including organic compounds according to various embodiments of the present invention.

Exemplary embodiments of the present invention will hereinafter be described in detail. However, these embodiments are only exemplary, and the present invention is not limited thereto.

The material for an organic electro-optical device according to one embodiment of the present invention includes may be used singularly or as a host material in combination with a dopant. The material includes an asymmetric fluorene derivative compound of the following Formula 1.

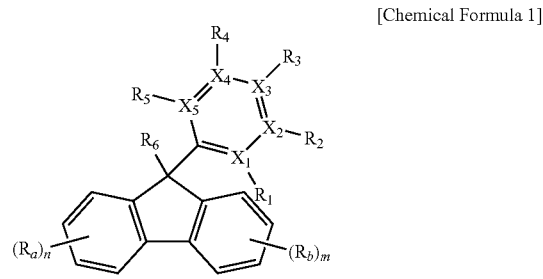

[Chemical Formula 1]

In the above Formula 1:

$X_1$ to $X_5$ are independently carbon or nitrogen;

when $X_1$ to $X_5$ are carbon, $R_1$ to $R_5$ bound to $X_1$ to $X_5$ are substituents bound to the carbon;

when $X_1$ to $X_5$ are nitrogen, $R_1$ to $R_5$ bound to $X_1$ to $X_5$ are unshared electron pairs;

$R_6$ is a substituent;

substituents of $R_1$ to $R_6$ may form a cycle together;

$R_1$ to $R_6$ are independently substituents selected from the group consisting of hydrogen, a substituted or unsubstituted aryl, a substituted or unsubstituted heteroaryl, a substituted or unsubstituted alkyl, a substituted or unsubstituted amino, a substituted or unsubstituted alkoxy, a halogen, a nitro, a substituted or unsubstituted arylene, a substituted or unsubstituted heteroarylene, and a substituted or unsubstituted alkylene;

$R_a$ and $R_b$ are independently selected from the group consisting of hydrogen, a C1 to C10 alkyl, and a C1 to C10 alkoxy; and n and m are independently integers ranging from 1 to 4.

Chemical Formula 1 has an asymmetric structure where a substituent (functional unit) as a light emitting unit or a host material is bound at the 9$^{th}$ carbon, and benzene rings including 1$^{st}$ to 8$^{th}$ carbons are positioned while the substituent and benzene rings are positioned at sterically different spaces from each other. Accordingly, amorphous characteristics of the material are improved and therefore film and device characteristics can also be improved. This far, materials having substituents at a meta position, that is, substituents at the 9$^{th}$ carbon, materials having a heteroaryl such as pyridine or pyrimidine, or an organic electro-optical device including the materials, has not been reported.

The materials for an organic electro-optical device having the above Formula 1 include the compounds represented by the following Formulae 2 to 7, but are not limited thereto.

[Chemical Formula 2]

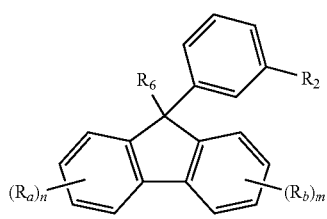

[Chemical Formula 3]

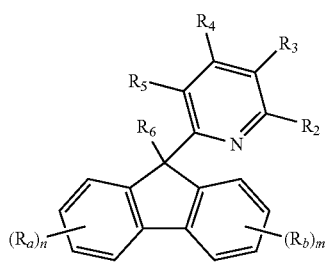

[Chemical Formula 4]

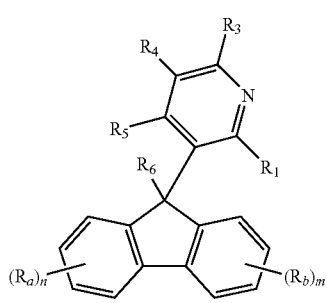

[Chemical Formula 5]

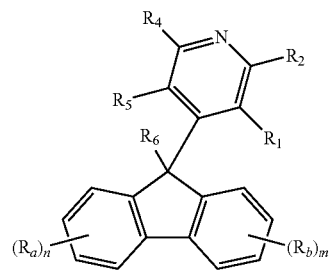

[Chemical Formula 6]

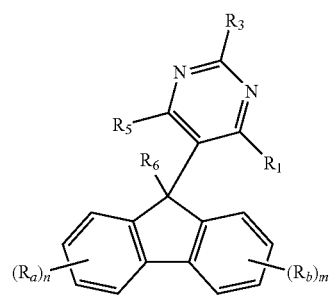

[Chemical Formula 7]

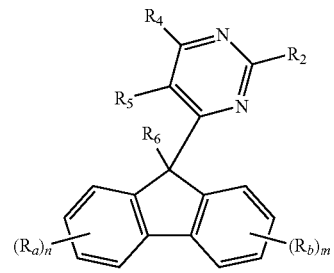

In the above Formulae 2 to 7:

$R_1$ to $R_6$ are independently substituents selected from the group consisting of hydrogen, a substituted or unsubstituted aryl, a substituted or unsubstituted heteroaryl, a substituted or unsubstituted alkyl, a substituted or unsubstituted amino, a substituted or unsubstituted alkoxy, a halogen, a nitro, a substituted or unsubstituted arylene, a substituted or unsubstituted heteroarylene, and a substituted or unsubstituted alkylene, or substituents of $R_1$ to $R_6$ form a cycle together;

$R_a$ and $R_b$ are independently selected from the group consisting of hydrogen, a C1 to C10 alkyl, and a C1 to C10 alkoxy; and n and m are independently integers ranging from 1 to 4.

The material for an organic electro-optical device of the above Formulae 1 to 7 according to the present invention has a glass transition temperature of 120° C. or more, and a thermal decomposition temperature of 450° C. or more.

Specific examples of the material for an organic electro-optical device of the above Formulae 1 to 7 are the following compounds (1) to (41) and mixtures thereof, but are not limited thereto.

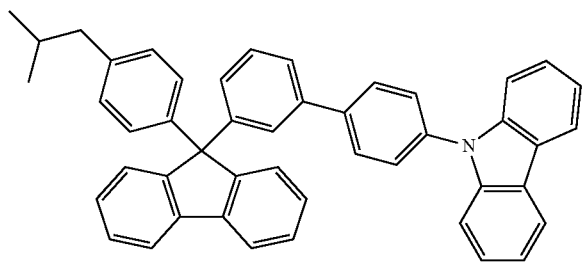
1
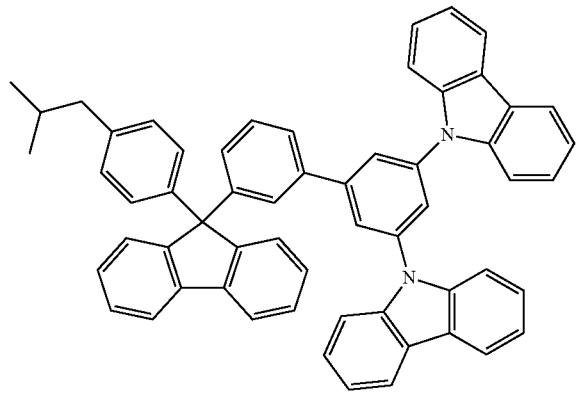
2
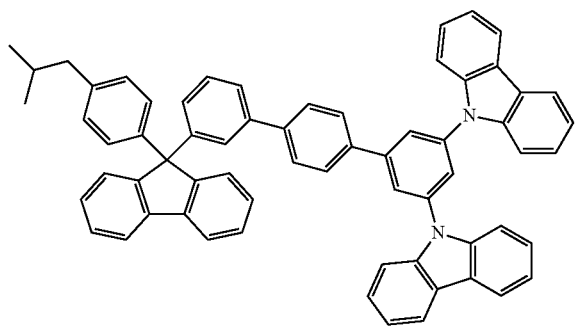
3
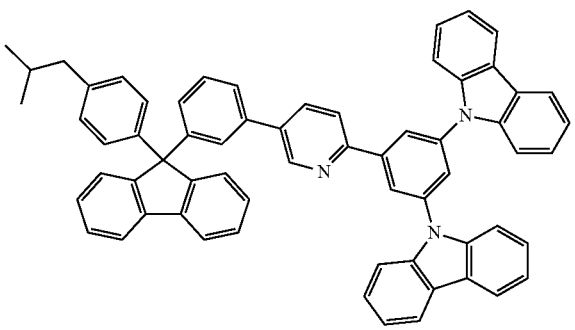
4
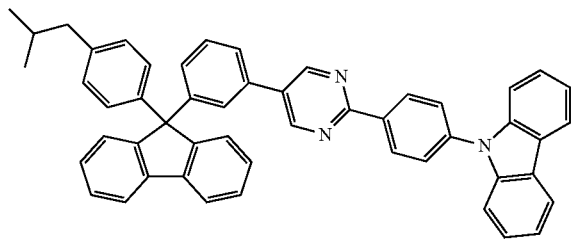
5
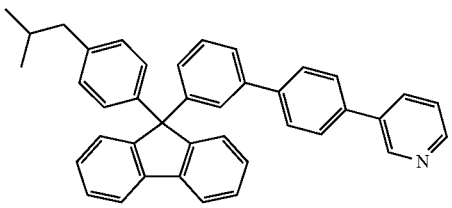
6
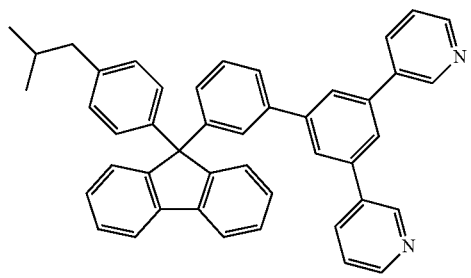
7
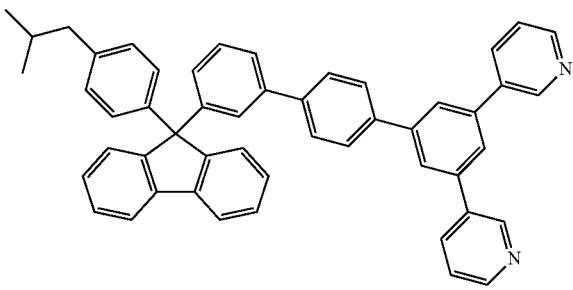
8

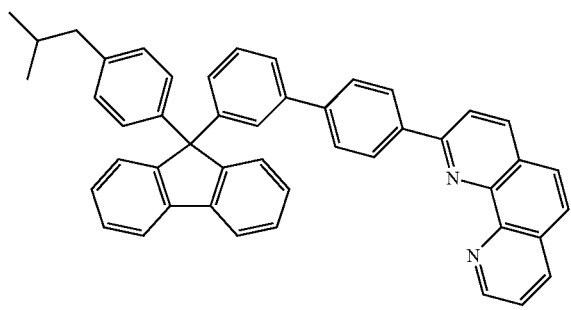
9
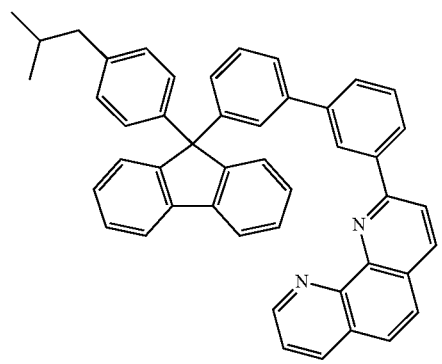
10
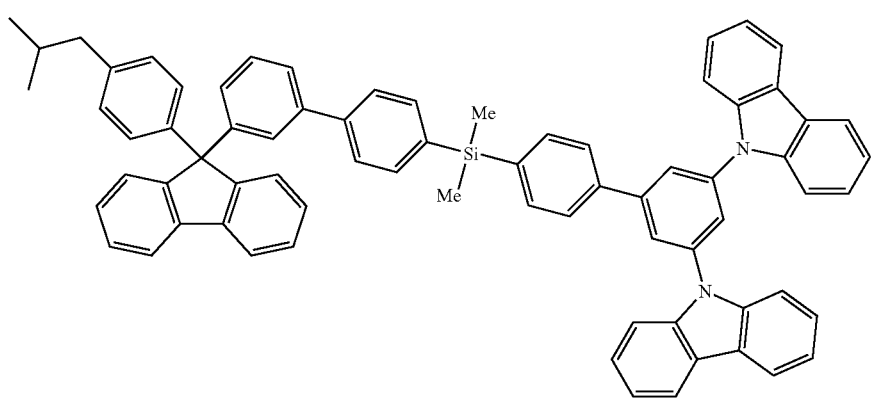
11
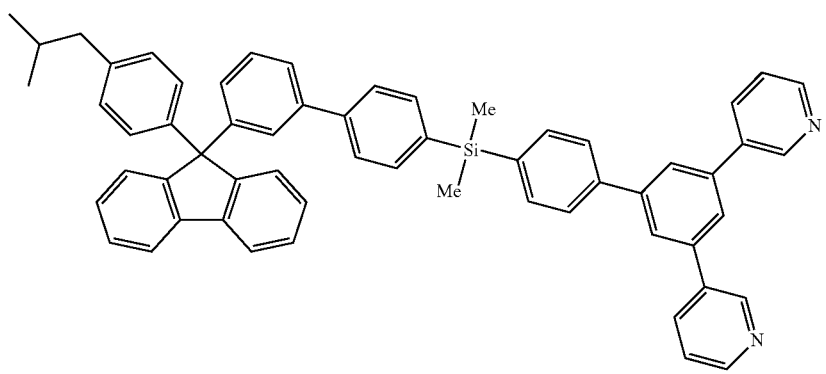
12
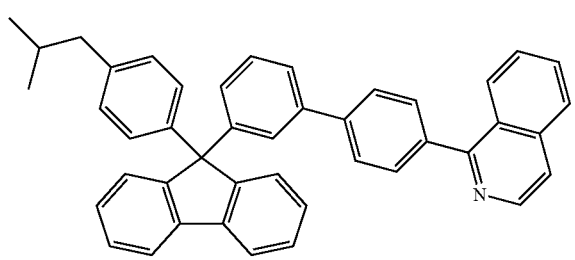
13
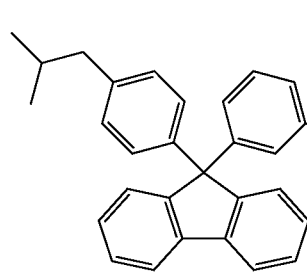
14

-continued
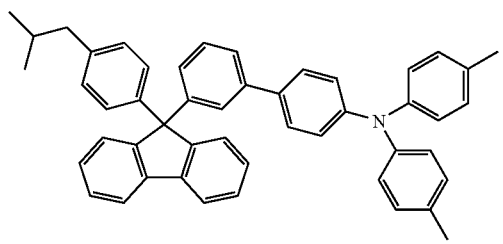
15
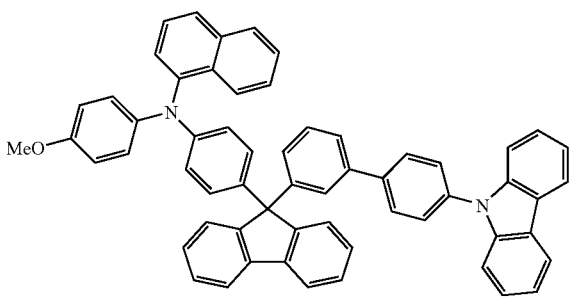
16
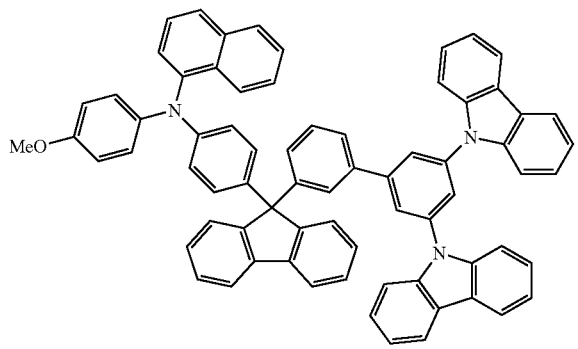
17
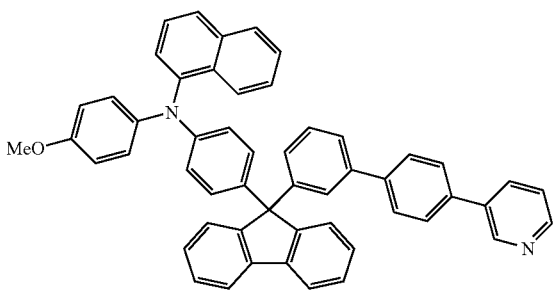
18
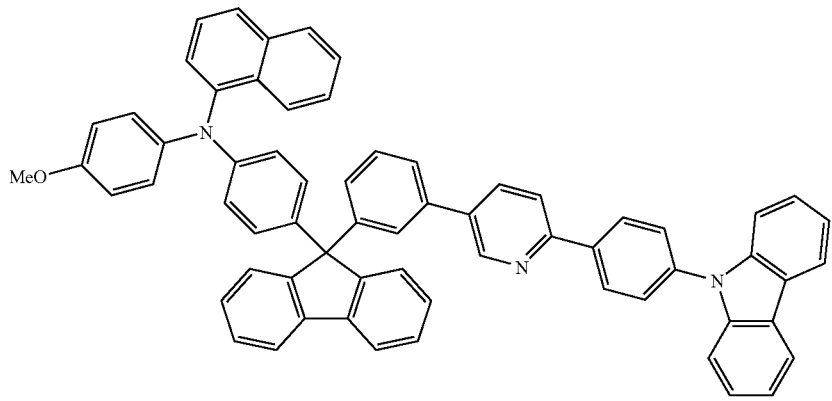
19
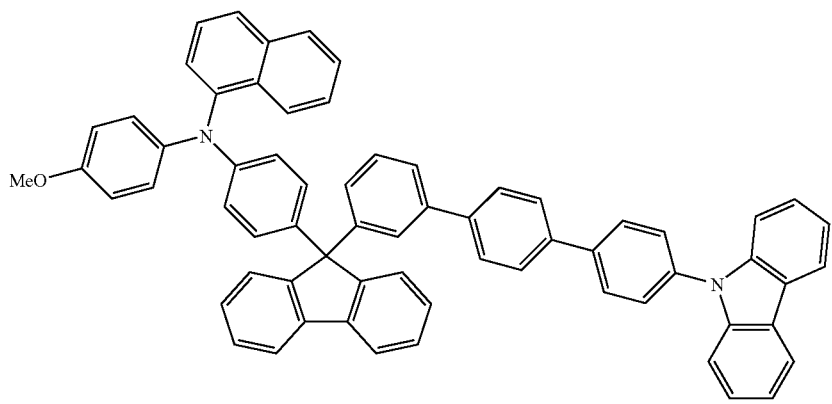
20

21
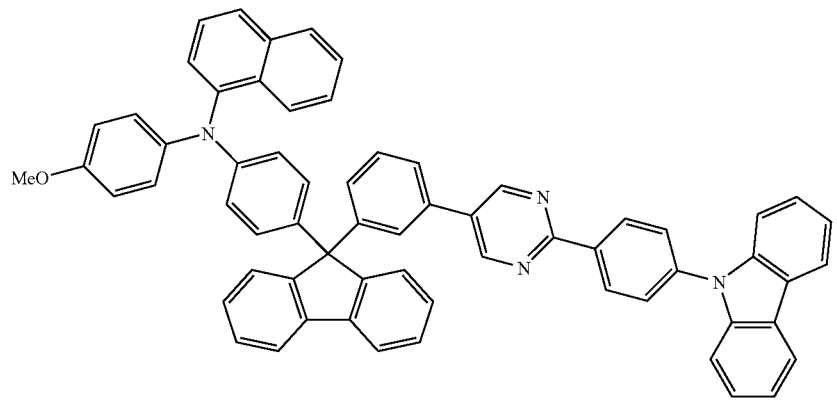
22
23
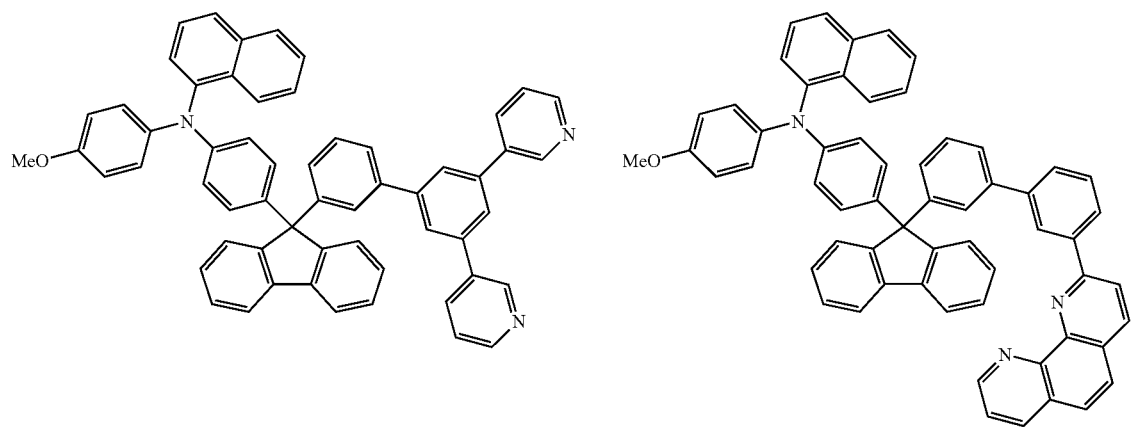
24
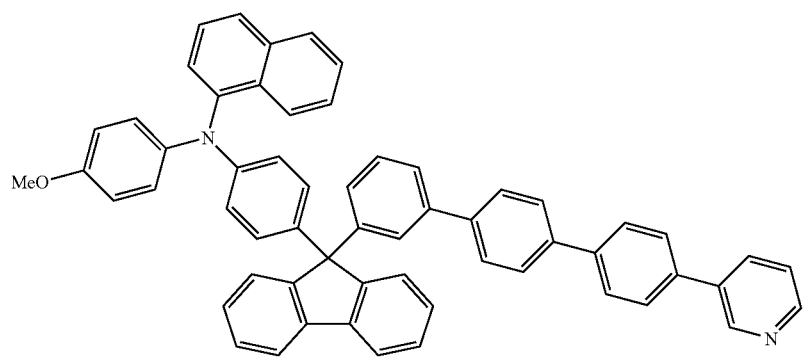
25 26
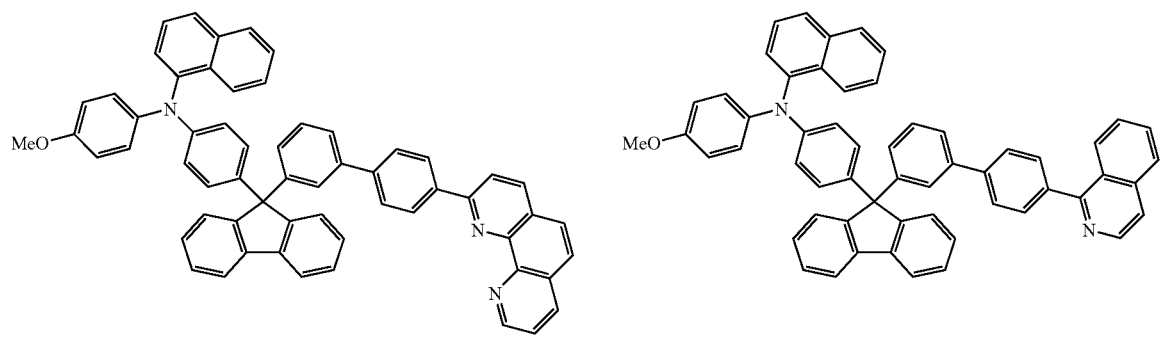

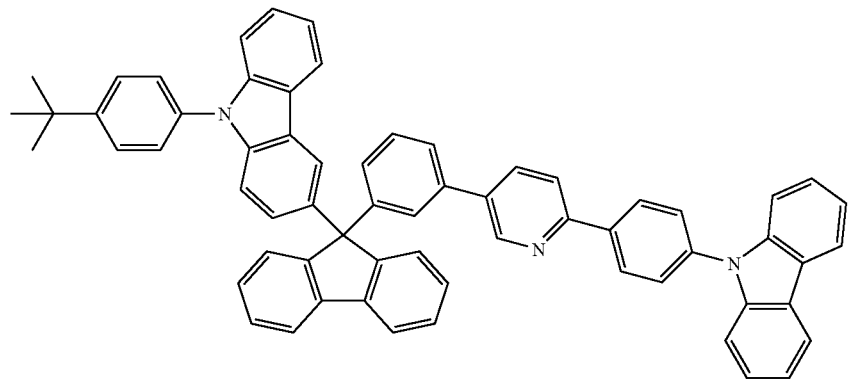
27
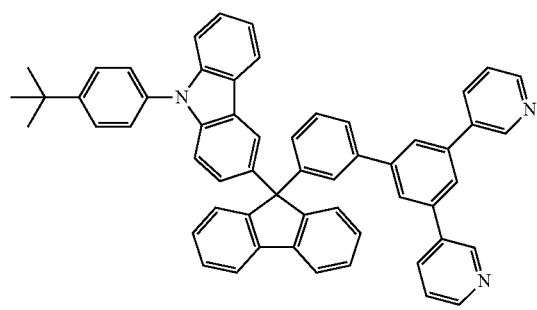
28
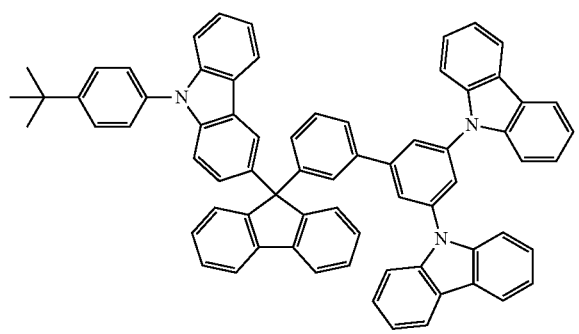
29
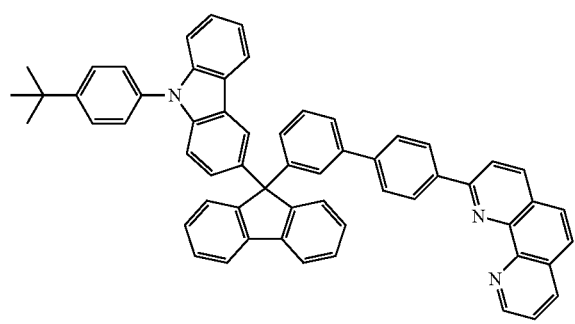
30
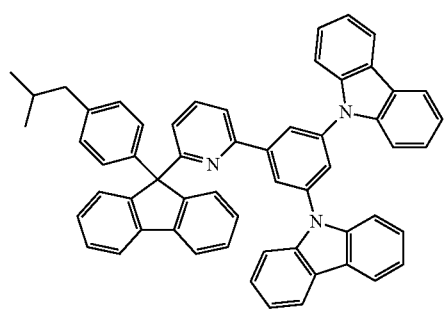
31
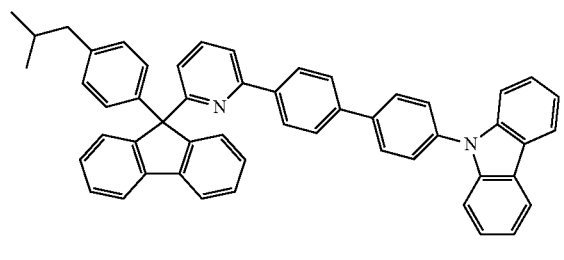
32
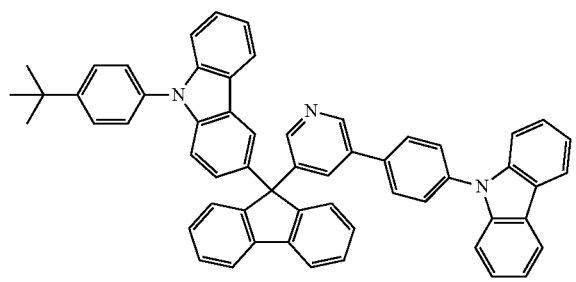
33

-continued

34

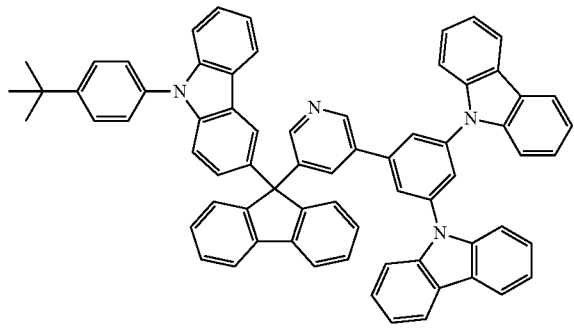

35

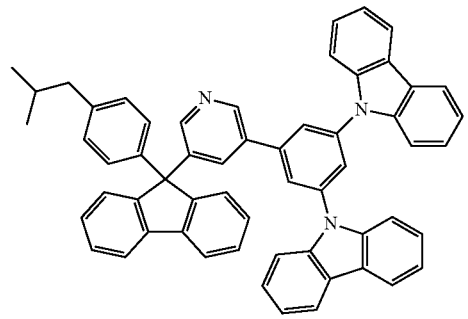

36

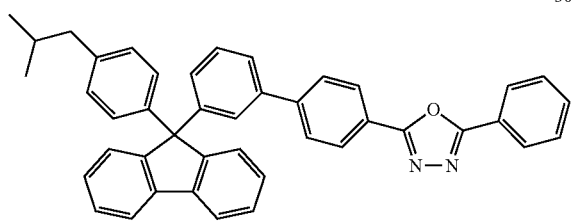

37

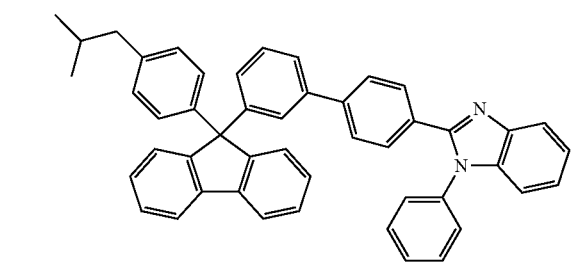

38

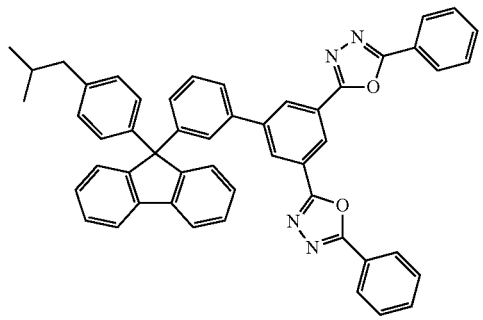

39

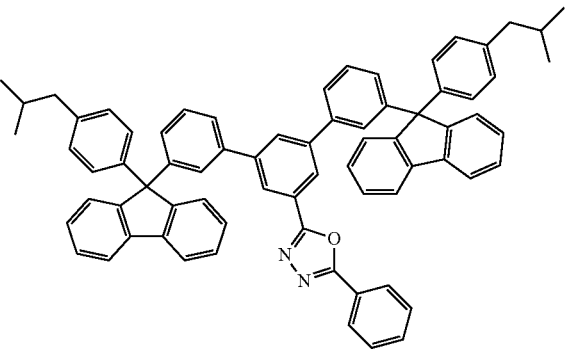

40

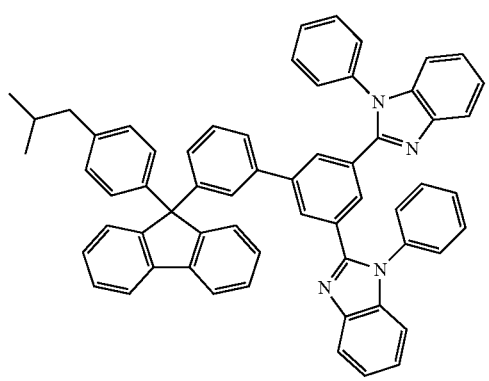

41

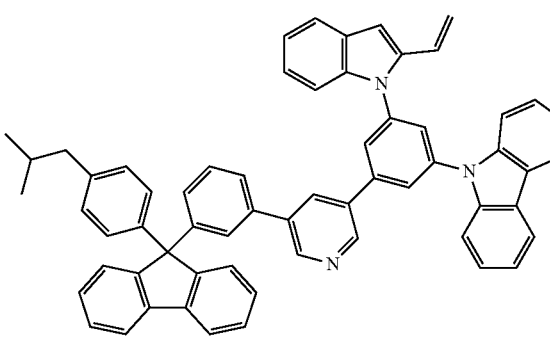

The material for an organic electro-optical device may be used by itself, but it is generally used as a host material that is capable of binding with a dopant.

The dopant is a compound having a high emission property by itself. However, it is usually added to a host in a minor amount, so it is also called a guest or dopant.

In other words, the dopant is a material that is doped to the host material to emit light, and generally includes a metal complex that emits light due to multiplet excitation into a triplet or higher state.

The materials for an organic electro-optical device are used for a light emitting host material, and all of red (R) color, green (G) color, blue (B) color, and white (W) fluorescent or phosphorescent dopant materials are available for a dopant. According to one embodiment, the dopant includes a phosphorescent dopant material. Generally, the material should satisfy the requirement to have high light emitting quantum efficiency, to be rarely agglomerated, and to be distributed uniformly in the host material.

The phosphorescent dopant is an organic metal compound including at least one element selected from the group consisting of Ir, Pt, Os, Ti, Zr, Hf, Eu, Tb, Tm, and combinations thereof.

Specifically, the red phosphorescent dopant may include PtOEP, Ir(Piq)$_2$(acac) (Piq=1-phenylisoquinoline, acac=pentane-2,4-dione), Ir(Piq)$_3$, and RD 61 from UDC; the green phosphorescent dopant may include Ir(PPy)$_3$(PPy=2-phenylpyridine), Ir(PPy)$_2$(acac), tris(2-phenylpyridine)iridium(Ir(ppy)3), and GD48 from UDC; and the blue phosphorescent dopant may include (4,6-F$_2$PPy)$_2$Irpic (reference: Appl. Phys. Lett., 79, 2082-2084, 2001).

The material for an organic electro-optical device can be included in an organic thin layer between an anode and a cathode of an organic electro-optical device. Such an electro-optical device includes an organic light emitting diode (OLED), an organic solar cell, an organic photo conductor drum, an organic transistor, an organic memory device, and so on.

FIGS. 1 to 5 are cross-sectional views showing exemplary embodiments of organic electro-optical devices including the organic materials according to various embodiments of the present invention.

Referring to FIGS. 1 to 5, an organic electro-optical device according to one embodiment of the present invention includes at least one layer of an organic thin layer interposed between an anode and a cathode. The anode includes a transparent electrode such as ITO (indium tin oxide), and the cathode includes a metal electrode such as aluminum.

Referring to FIG. 1, the organic electro-optical device includes an organic thin layer including only an emission layer.

Figure 2:
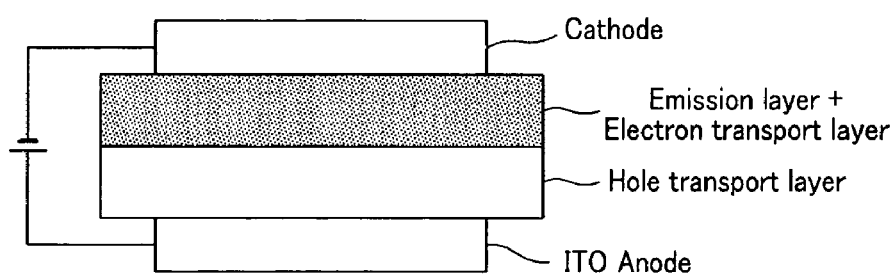

Referring to FIG. 2, a double-layered organic electro-optical device includes an organic thin layer including an emission layer plus an electron transport layer (ETL), and a hole transport layer (HTL). The hole transport layer (HTL) is a separate layer having an excellent binding property with a transparent electrode such as ITO or an excellent hole transporting property.

Figure 3:
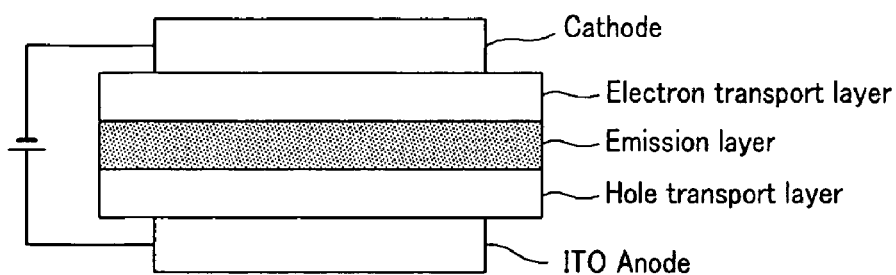

Referring to FIG. 3, a three-layered organic electro-optical device includes the organic thin layer including an electron transport layer (ETL), an emission layer, and a hole transport layer (HTL). The emission layer is independently installed, and layers having an excellent electron transporting property or an excellent hole transporting property are separately stacked.

Figure 4:
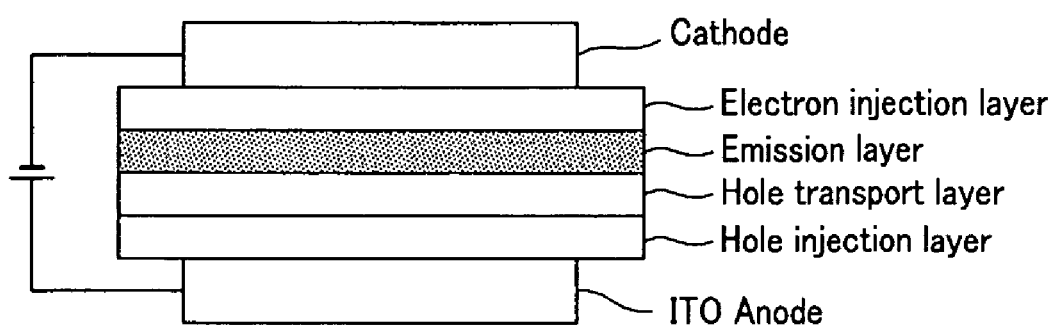

As shown in FIG. 4, a four-layered organic electro-optical device includes the organic thin layer including an electron injection layer (EIL), an emission layer, a hole transport layer (HTL), and a hole injection layer (HIL) for binding with the cathode of ITO, different from the structure of the three-layered organic electro-optical device shown in FIG. 3.

Figure 5:
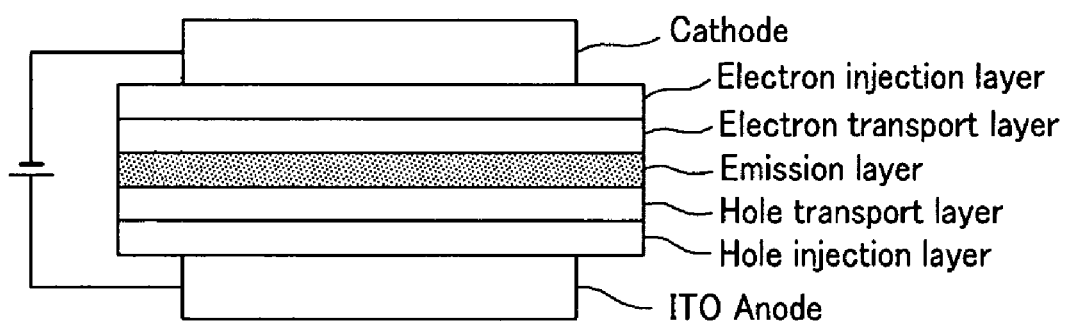

As shown in FIG. 5, a five layered organic electro-optical device includes the organic thin layer including an electron transport layer (ETL), an emission layer, a hole transport layer (HTL), and a hole injection layer (HIL), and further includes an electron injection layer (EIL) to achieve a low voltage.

In order to form the organic thin layer having one through five layers, the method may follow a dry coating method such as evaporation, sputtering, plasma plating, and ion plating, or a wet coating method such as spin coating, dipping, and flow coating.

Hereinafter, in the following examples and comparative examples, materials for an organic electro-optical device according to examples of the present invention has been synthesized and organic electro-optical devices using the materials for an organic electro-optical device have been fabricated to show improvement of luminous efficiency. A person having ordinary skills in this art can sufficiently understand parts of the present invention that are not specifically described.

1. Synthesis of a Compound for an Organic Electro-Optical Device

Synthesis Example 1

Synthesis of Compound 2

A compound 2 for a material for an organic electro-optical device was synthesized according to the following Reaction Scheme 1.

[Reaction Scheme 1]

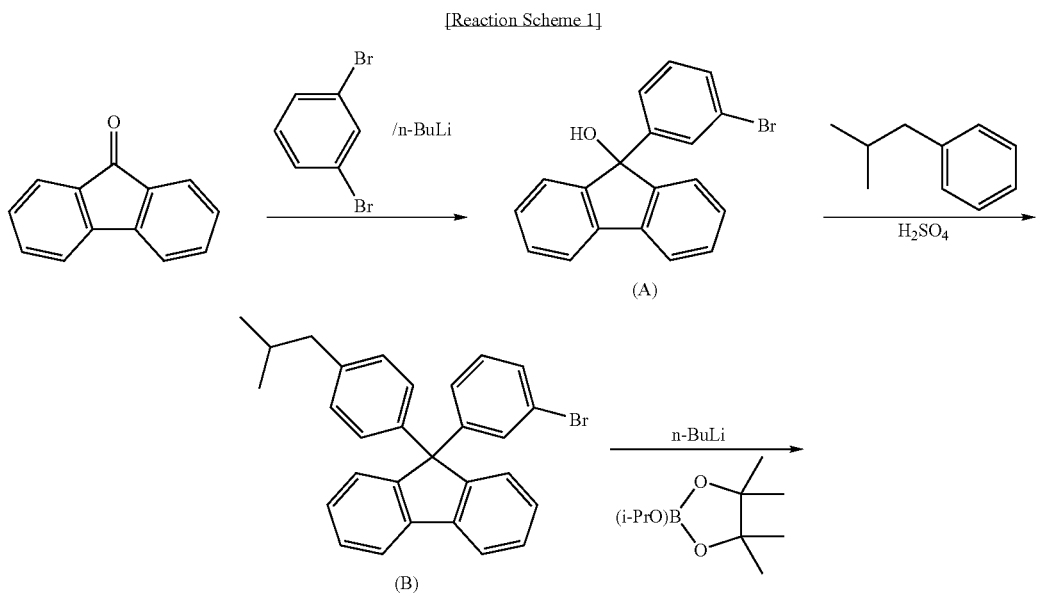

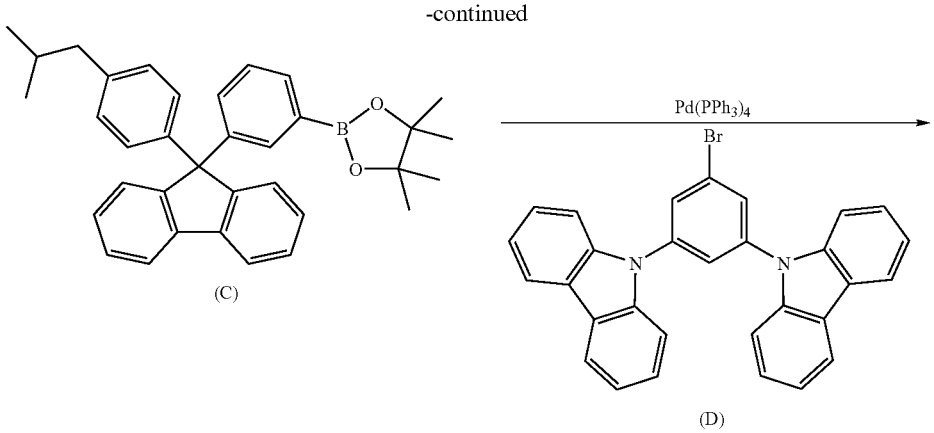

(C)

(D)

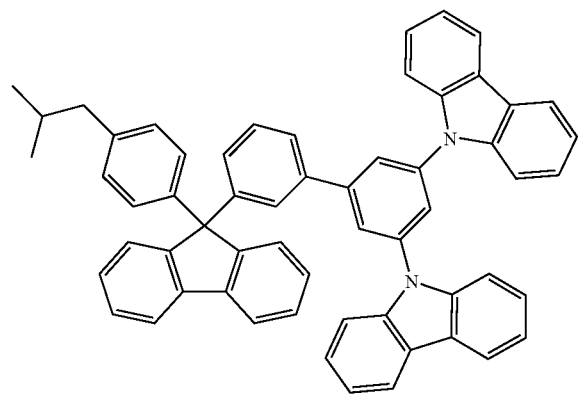

2

First of all, 3.7 g of 1,3-dibromobenzene was dissolved in 30 of tetrahydrofuran. The solution was cooled to −78° C., and then 10 ml of 1.6M n-butyl lithium prepared by using hexane was added thereto in a dropwise fashion. The resulting product was agitated for 30 minutes and then added to another solution prepared by dissolving 2.7 g of 9-fluorenone in 20 ml of tetrahydrofuran in a dropwise fashion, while keeping it at 0° C. The resulting mixture was heated to room temperature and agitated for 2 hours and 0.5 ml of water was added thereto to complete the reaction, and was then concentrated under a reduced pressure. The resultant was purified by column chromatography, acquiring 4.5 g of an intermediate (A).

4.5 g of the intermediate (A) was dissolved in 20 ml of of isobutyl benzene and then 1 ml of sulfuric acid was added thereto, while vigorously agitating them together. The resulting product was heated to 100° C., agitated for 8 hours, and then cooled to room temperature. Then, an organic layer was extracted three times with 20 ml of a 1M sodium carbonate aqueous solution, condensed under reduced pressure, and purified by column chromatography, acquiring 3 g of an intermediate (B).

3 g of the intermediate (B) was dissolved in 30 ml of tetrahydrofuran. The solution was cooled to −78° C., and 4.5 ml of 1.6M n-butyl lithium prepared with hexane was added thereto in a dropwise fashion. The resulting product was agitated at −78° C. for 1 hour, and 2.7 ml of isopropyl tetramethyl dioxaborolane was added thereto. The mixed solution was heated to room temperature and agitated for 8 hours. 0.5 ml of water was added thereto to complete the reaction, and resulting product was concentrated under reduced pressure. Then, it was purified by column chromatography, acquiring 2.9 g of an intermediate (C).

Next, 0.5 g of the intermediate (C), 0.5 g of a compound (D), and 10 mg of tetrakis-(triphenyl phosphine) palladium were dissolved in a mixed solvent of 5 ml of tetrahydrofuran and 5 ml of toluene. Then, 5 ml of tetraethylammonium hydroxide aqueous solution in a 20 wt % concentration was added thereto. The resulting product was agitated at 80° C. for 8 hours. Its aqueous solution layer was removed therefrom and condensed under reduced pressure. It was purified by column chromatography, acquiring 0.7 g of a compound 2.

The compound had MS (ESI) m/z 781.35 (M+H) as a result of mass spectroscopy analysis.

Synthesis Example 2

Synthesis of Compound 3

A compound 3 for a material for an organic electro-optical device was prepared according to the following Reaction Scheme 2.

[Reaction Scheme 2]

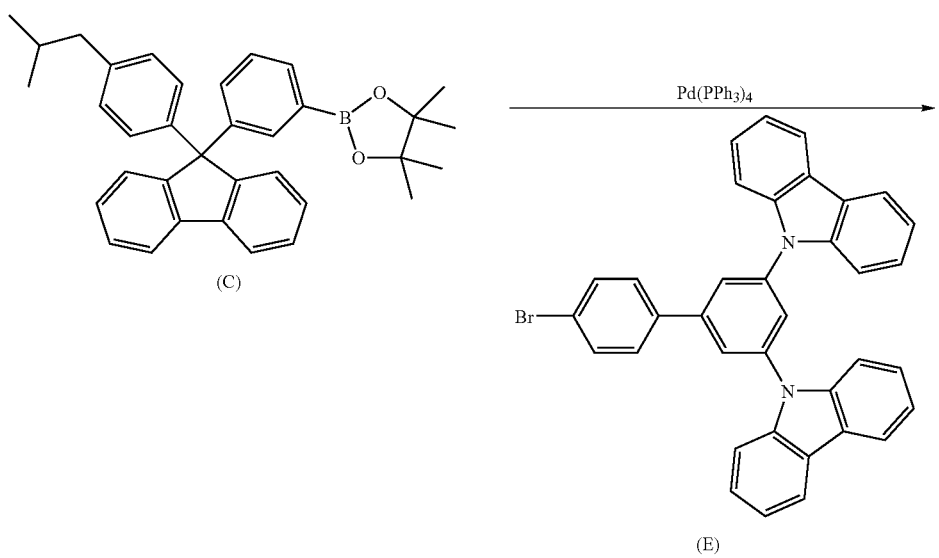

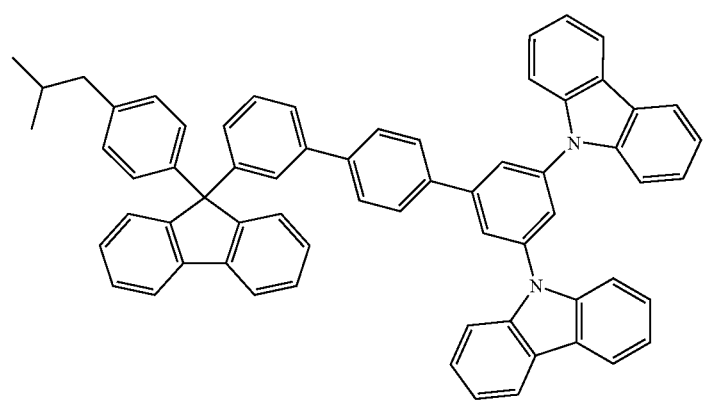

3

First, 0.5 g of the intermediate (C), 0.6 g of a compound (E), and 10 mg of tetrakis-(triphenyl phosphine) palladium were dissolved in a mixed solvent of 5 ml of tetrahydrofuran and 5 ml of toluene. Then, 5 ml of a tetraethylammonium hydroxide aqueous solution in a 20 wt % concentration was added to the solution. The resulting solution was agitated at 80° C. for 8 hours. Its aqueous solution layer was removed therefrom and concentrated under reduced pressure. It was purified by column chromatography, acquiring 0.8 g of a compound 3. The compound had MS (ESI) m/z 857.38 (M+H) as a result of mass spectroscopy analysis.

Synthesis Example 3

Synthesis of Compound 7

A compound 7 for a material for an organic electro-optical device was prepared according to the following Reaction Scheme 3.

[Reaction Scheme 3]

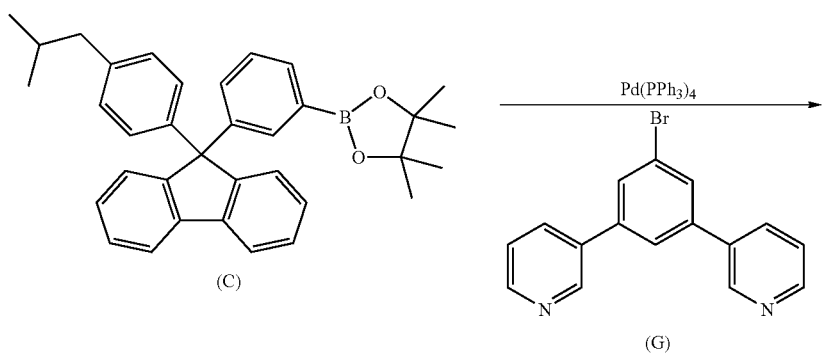

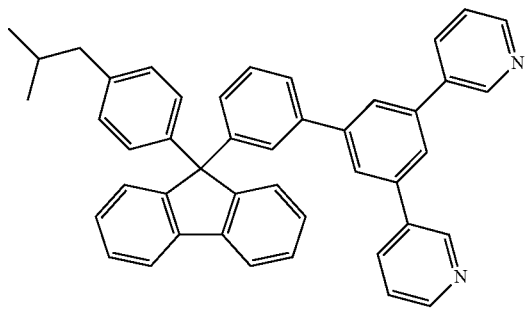

First, 0.5 g of the intermediate (C), 0.3 g of a compound (G), and 10 mg of tetrakis-(triphenyl phosphine) palladium were dissolved in a mixed solvent of 5 ml of tetrahydrofuran and 5 ml of toluene. Then, 5 mg of a tetraethylammonium hydroxide aqueous solution in a 20 wt % concentration was added thereto. The resulting product was agitated at 80° C. for 8 hours. Its aqueous solution layer was removed therefrom and concentrated under reduced pressure. It was purified by column chromatography, acquiring 0.4 g of a compound 7. The compound had MS (ESI) m/z 605.29 (M+H)+ as a result of mass spectroscopy analysis.

Synthesis Example 4

Synthesis of Compound 8

A compound 8 for a material for an organic electro-optical device was prepared according to the following Reaction Scheme 4.

[Reaction Scheme 4]

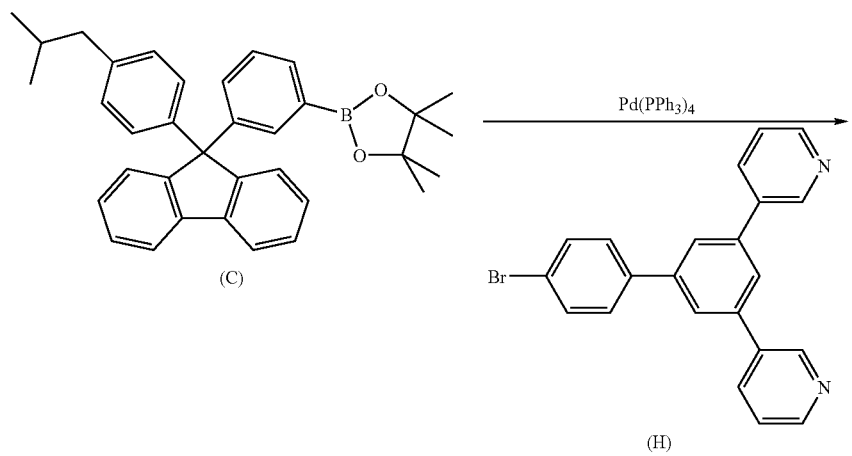

-continued

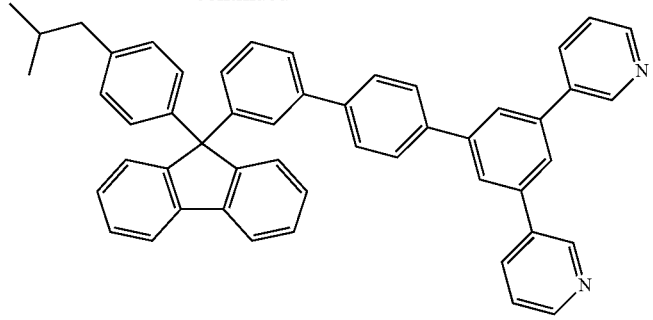

8

First, 0.5 g of the intermediate (C), 0.4 g of a compound (H), and 10 mg of tetrakis-(triphenyl phosphine) palladium were dissolved in a mixed solvent of 5 ml of tetrahydrofuran and 5 ml of toluene. Then, 5 ml of a tetraethylammonium hydroxide aqueous solution in a 20 wt % concentration was added thereto. The resulting solution was agitated at 80° C. for 8 hours. Its aqueous solution layer was removed therefrom and concentrated under reduced pressure. It was purified by column chromatography, acquiring 0.4 g of a compound 8. The compound had MS (ESI) m/z 681.32 (M+H)$^+$ as a result of mass spectroscopy analysis.

Synthesis Example 5

Synthesis of Compound 9

A compound 9 for a material for an organic electro-optical device was prepared according to the following Reaction Scheme 5.

First, 0.5 g of the intermediate (C), 0.3 g of a compound (I), and 10 mg of tetrakis-(triphenyl phosphine) palladium were dissolved in a mixed solvent of 5 ml of tetrahydrofuran and 5 ml of toluene. Then, 5 ml of a tetraethylammonium hydroxide aqueous solution in a 20 wt % concentration was added thereto. The resulting solution was agitated at 80° C. for 8 hours. Then, its aqueous solution layer was removed and concentrated under reduced pressure. It was purified by column chromatography, acquiring 0.5 g of a compound 9. The compound had MS (ESI) m/z 681.32 (M+H)$^+$ as a result of mass spectroscopy analysis.

Synthesis Example 6

Synthesis of Compound 41

A compound 41 for a material for an organic electro-optical device was prepared according to the following Reaction Scheme 6.

[Reaction Scheme 5]

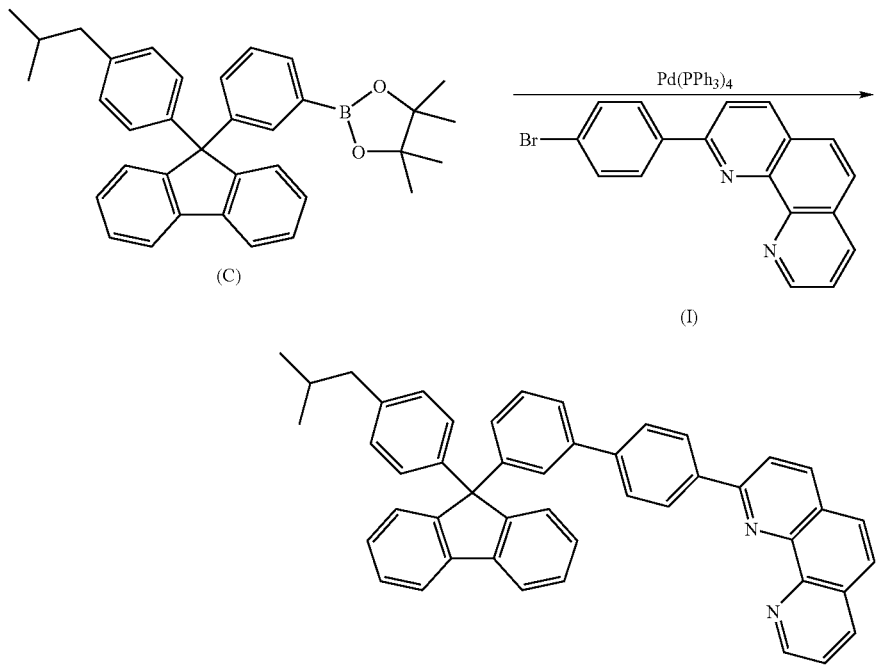

[Reaction Scheme 6]

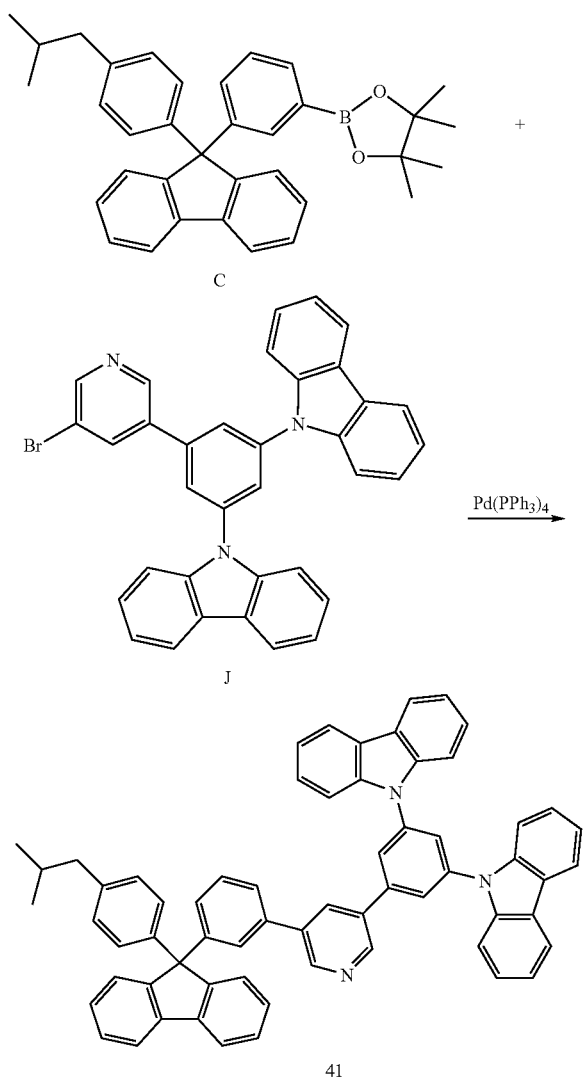

First, 0.5 g of the intermediate (C), 0.6 g of a compound (J), and 10 mg of tetrakis-(triphenyl phosphine) palladium were dissolved in a mixed solvent of a of tetrahydrofuran and 5 ml of toluene. Then, 5 ml of a tetraethylammonium hydroxide aqueous solution in a 20 wt % concentration was added thereto. The resulting solution was agitated at 80° C. for 8 hours. Its aqueous solution layer was removed therefrom and concentrated under reduced pressure. It was purified by column chromatography, acquiring 0.7 g of a compound 41. The compound had MS (ESI) m/z 858.38 (M+H)$^+$ as a result of mass spectroscopy analysis.

Then, the synthesized materials were measured regarding glass transition and thermal decomposition temperatures using DSC and TGA.

2. Fabrication of an Organic Light Emitting Diode

Example 1

The compound 2 of Synthesis Example 1 as a host and Ir(PPy)$_3$ as a dopant were used to fabricate an organic light emitting diode with the following structure.

Herein, ITO was provided at a thickness of 1000 Å for an anode, and aluminum (Al) was provided at a thickness of 1000 Å for a cathode.

The organic light emitting diode had five layers. In particular, it had a five-layer structure of NPD 400 Å/compound 2+Ir(PPy)$_3$ (10 wt %, 300 Å)/BAlq 50 Å/Alq$_3$ 200 Å/LiF 5 Å.

In particular, a method of manufacturing an organic electro-optical device may be described in detail as follows: cutting an ITO glass substrate having a sheet resistance value of 15 Ψ/cm$^2$ into a size of 50 mm×50 mm×0.7 mm for a cathode; ultrasonic wave cleaning the same in acetone, isopropyl alcohol, and pure water for 15 minutes, respectively; and UV ozone cleaning it for 30 minutes.

N,N'-di(1-naphthyl)-N,N'-diphenylbenzidine (NPD) was deposited on the front surface of the substrate under the conditions of a vacuum degree of 650×10$^{-7}$ Pa and a deposition speed of 0.1 to 0.3 nm/s to provide a hole transport layer (HTL).

Next, the compound 2 was used to form a 300 Å-thick emission layer under the same vacuum deposit condition. Ir(PPy)$_3$, a phosphorescent dopant, was deposited at the same time.

Herein, it was deposited in an amount of 10 wt % based on 100 wt % of the total amount of an emission layer, while controlling its deposition speed.

BAlq was deposited on the upper surface of the emission layer under the same vacuum deposition conditions to provide a 50 Å-thick hole inhibition layer. Then, Alq3 was deposited under the same vacuum deposition conditions to provide a 200 Å-thick electron transport layer. On the upper surface of the electron transport layer, LiF and Al were sequentially deposited to provide an organic light emitting diode.

Examples 2 to 5

An organic light emitting diode with a structure of ITO/NPD 400 Å/host+Ir(PPy)$_3$ (10 wt %, 300 Å)/BAlq 50 Å/Alq$_3$ 200 Å/LiF 5 Å/Al 1000 Å was fabricated according to the same method as in Example 1 except for respectively using compound 3, 8, 9, and 41 instead of the compound 2 as a host.

Comparative Example 1

An organic light emitting diode with a structure of ITO/NPD 400 Å/CBP+Ir(PPy)$_3$ (10 wt %, 300 Å)/BAlq 50 Å/Alq$_3$ 200 Å/LiF 5 Å/Al 1000 Å was fabricated according to the same method as in Example 1 by using 4,4'-N,N'-dicarbazole diphenyl (CBP) represented by the following Formula 8 instead of the compound 2.

[Chemical Formula 8]

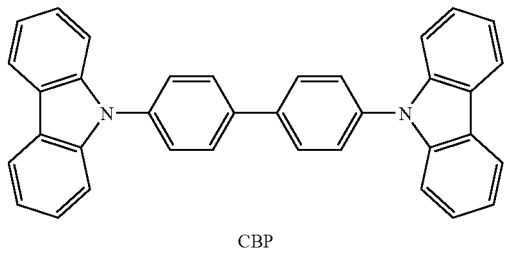

CBP

3. Current Density, Luminance, and Luminous Efficiency According to a Voltage Change The organic light emitting diodes according to Examples 1 to 5 and Comparative Example 1 were measured regarding current density, luminance, and luminous efficiency changes in the following method.

1) Current Density According to a Voltage Change

Each organic light emitting diode was measured for a current value passing through the unit device using a current-voltage meter (Keithley 2400), while increasing the voltage from 0V to 10V. The results are calculated by dividing the measured current value by the area.

2) Luminance According to a Voltage Change

Each organic light emitting diode was measured for luminance by a luminance meter (Minolta Cs-1000A) while increasing the voltage from 0V to 10V.

3) Luminous Efficiency

Luminous efficiency was calculated by using the luminance, current density, and voltage measured from the above 1) and 2).

4. Evaluation Result

Table 1 shows thermal analysis results (Tg and Td) and characteristic evaluation results of the organic light emitting diodes fabricated according to Examples 1 to 5 and Comparative Example 1.

TABLE 1

|  | Host material of emission layer | Tg (° C.) | Td (° C.) | Luminance (nit) | Driving voltage (V) | Luminous efficiency (lm/W) | Color coordinate (x, y) |
|---|---|---|---|---|---|---|---|
| Example 1 | compound 2 | 147 | 455 | 92 | 5.5 | 17.5 | 0.32, 0.60 |
| Example 2 | compound 3 | 167 | 518 | 104 | 6.0 | 16.6 | 0.31, 0.60 |
| Example 3 | compound 8 | — | 467 | 144 | 5.5 | 15.0 | 0.32, 0.60 |
| Example 4 | compound 9 | 128 | 492 | 100 | 5.2 | 17.0 | 0.31, 0.60 |
| Example 5 | compound 41 | 152 | 515 | 82 | 6 | 19.3 | 0.32, 0.61 |
| Comparative Example 1 | CBP | 128 | 392 | 100 | 6.1 | 14.0 | 0.30, 0.59 |

When the compounds 2, 3, 8, 9, and 41 used in Examples 1 to 5 were DSC analyzed, they has a very high glass transition temperature (Tg) of higher than 120° C. and no crystallization temperature (Tc) due to very low crystallinity, and thereby had an improved amorphous characteristic. In addition, as a result of TGA analysis, since they all had high thermal decomposition temperatures (Td) of higher than 450° C., they turned out to have excellent thermal stability.

Furthermore, since the organic light emitting diodes had a driving voltage ranging from 5 V to 6V around a luminance of 100 nit, they had equal or improved device performance compared with one including CBP of Comparative Example 1. Since they also had up to 38% improved electric power efficiency than the one including CBP, they turned out to have superbly improved device performance.

Therefore, the material for an organic light emitting diode of the present invention has high thermal stability, a low driving voltage, and high efficiency as an evaluation result of organic light emitting diodes, and thereby can improve the life-span of the organic light emitting diodes.

The present invention is not limited to the embodiments illustrated with the drawings and table, but can be fabricated into various modifications and equivalent arrangements included within the spirit and scope of the appended claims by a person who is ordinarily skilled in this field. Therefore, the aforementioned embodiments should be understood to be exemplary but not limiting the present invention in any way.

INDUSTRIAL APPLICABILITY

The material for an organic light emitting diode of the present invention has thermal stability. In addition, it is not easily crystallized and thereby has improved amorphousness. Accordingly, when it is applied to an organic thin layer of an organic electro-optical device, it can have high efficiency and a long life-span.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A material for an organic electro-optical device comprising an asymmetric fluorene derivative compound that is used singularly or as a host material in combination with a dopant, the material including at least one of the following compounds 1 to 41:

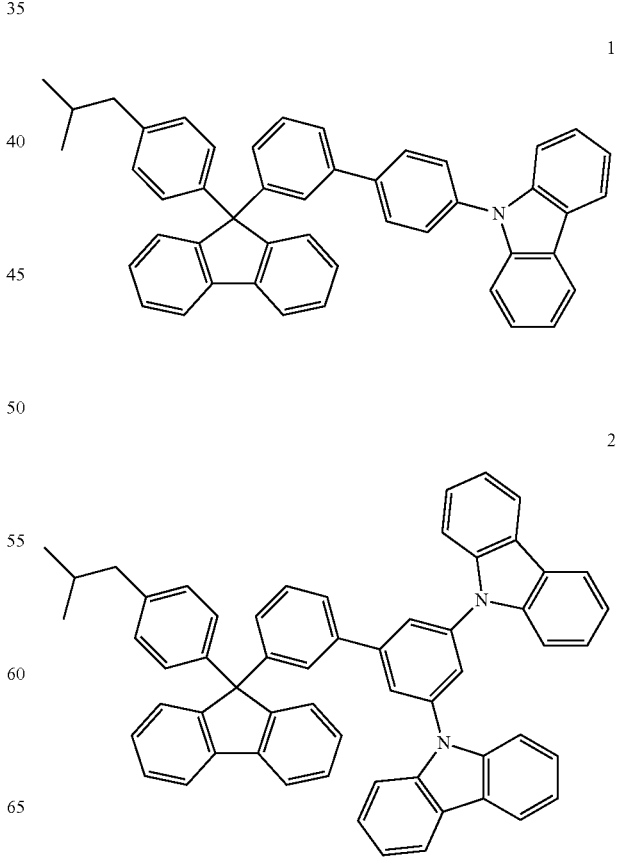

3
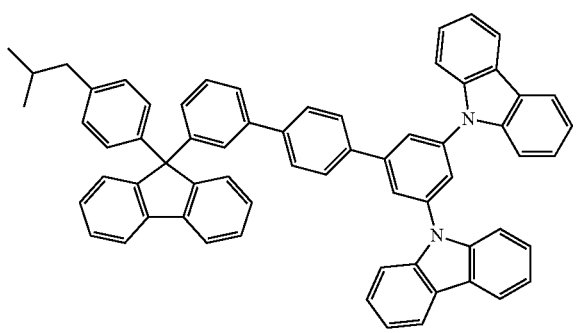
4
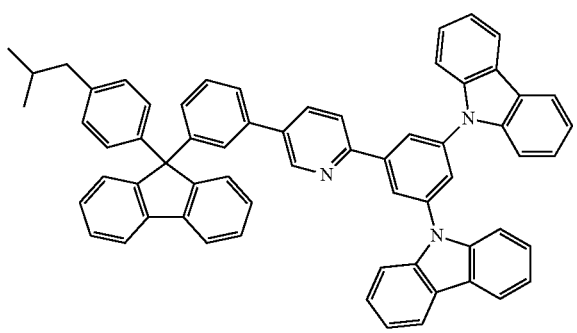
5
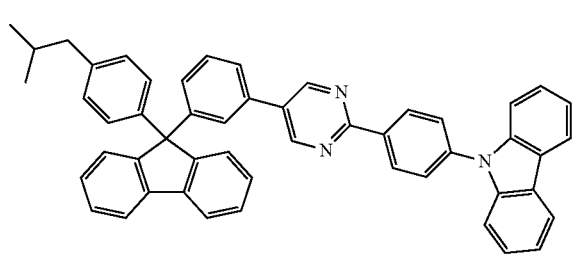
6
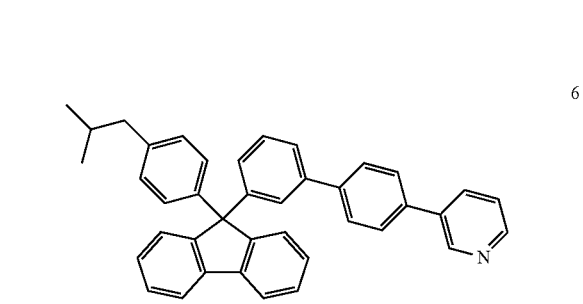
7
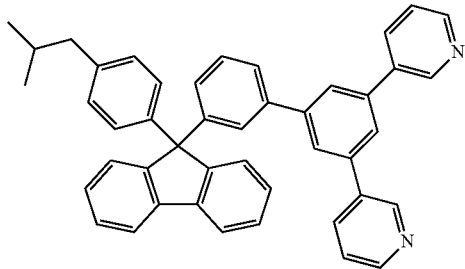
8
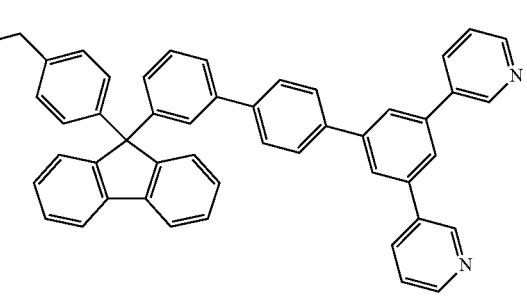
9
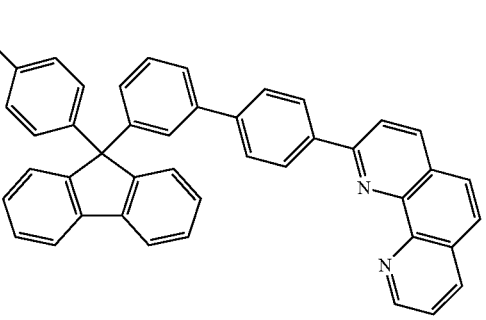
10
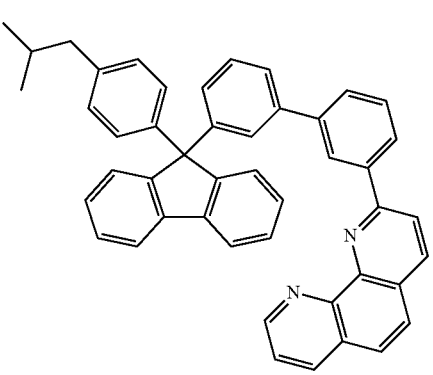
11
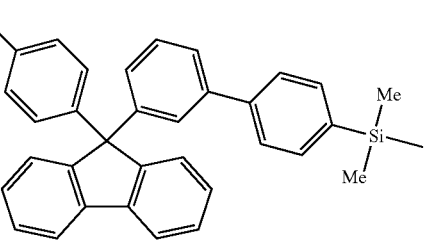

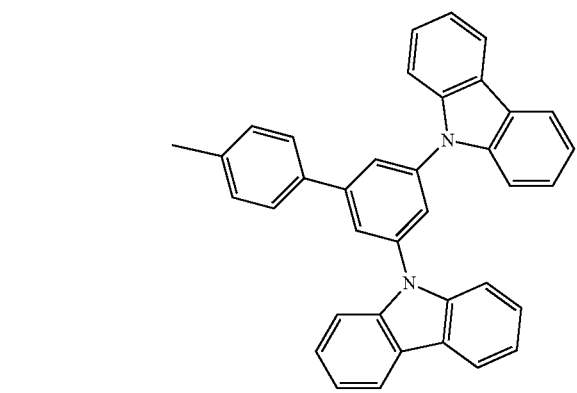
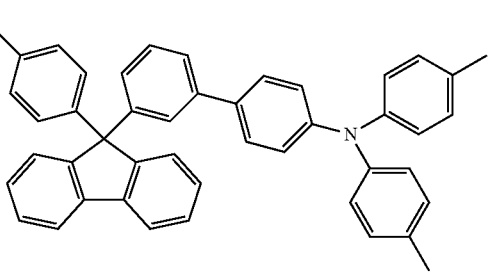
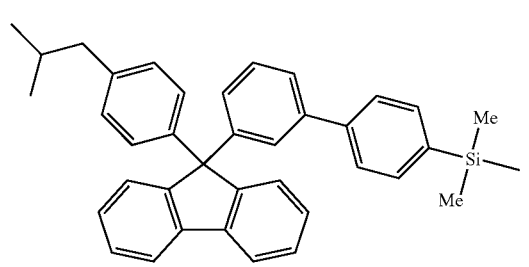
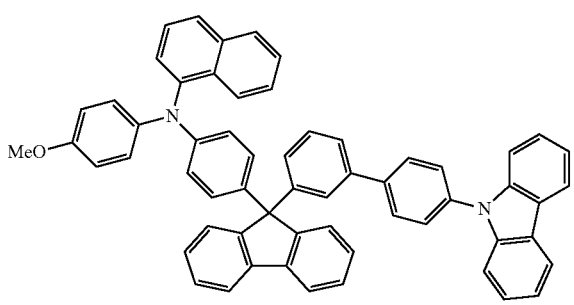
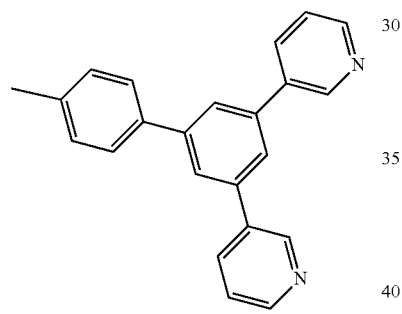
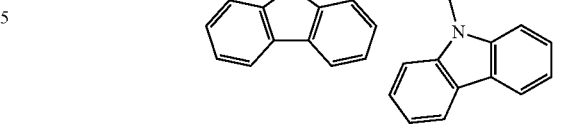
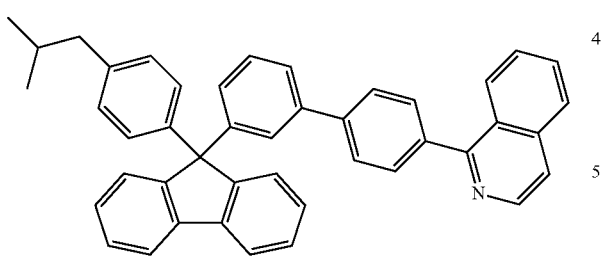
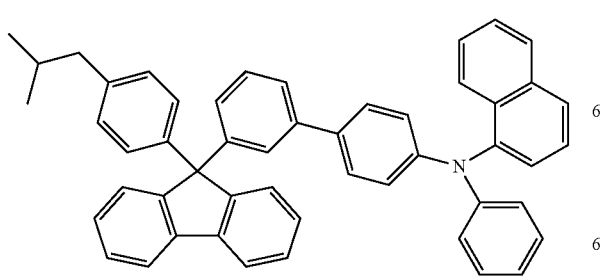
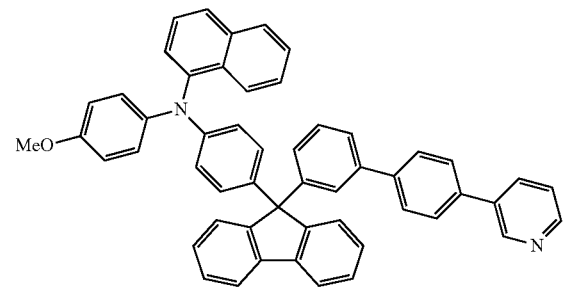

19
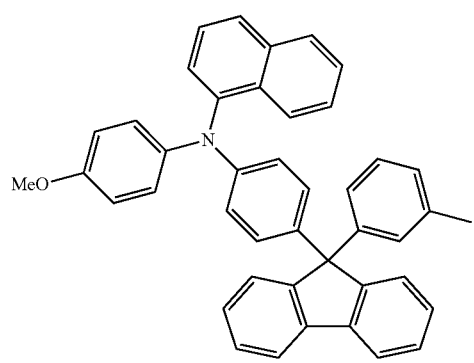
20
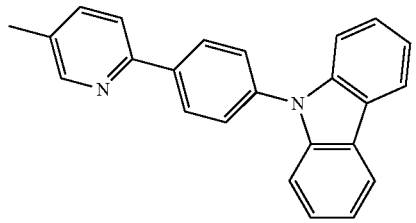
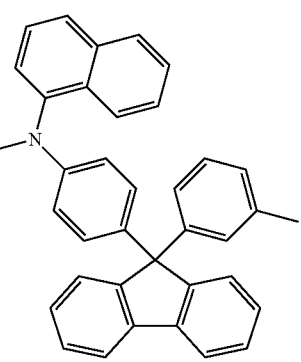
21
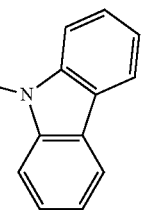
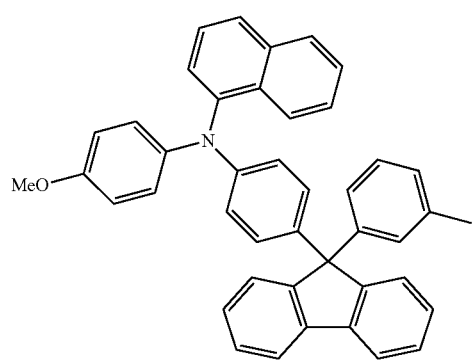
-continued
5
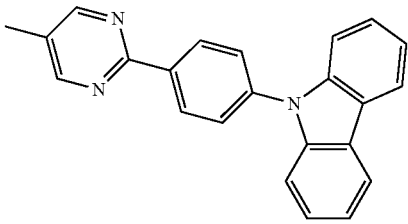
22
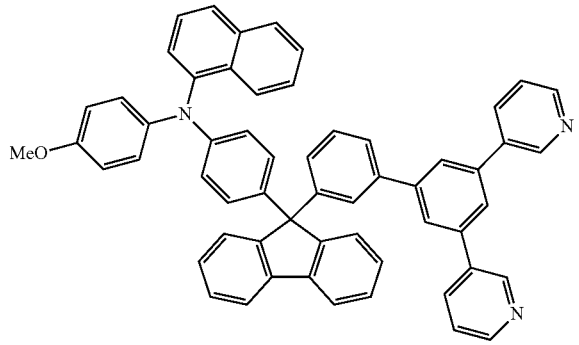
23
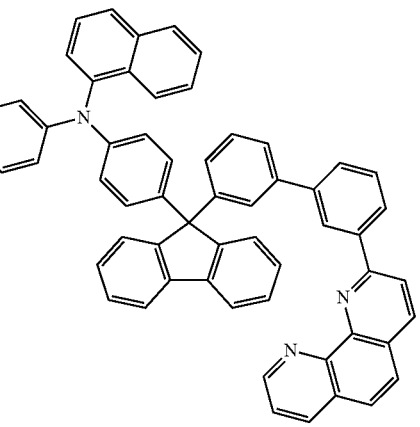
24
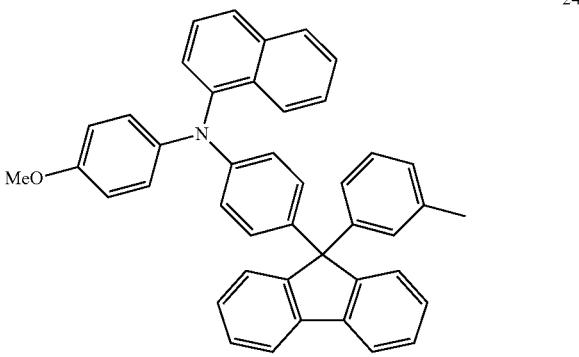
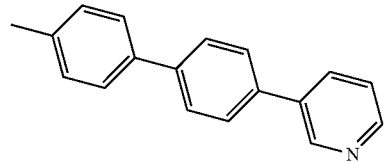

25
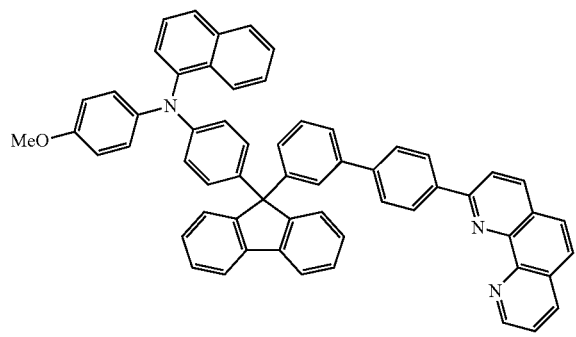
26
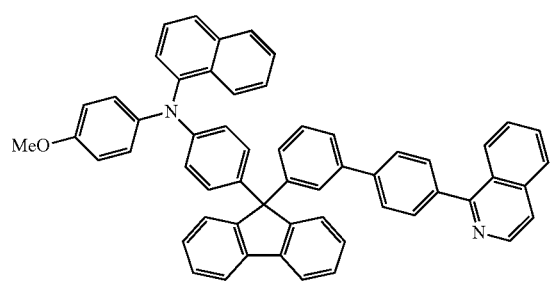
27
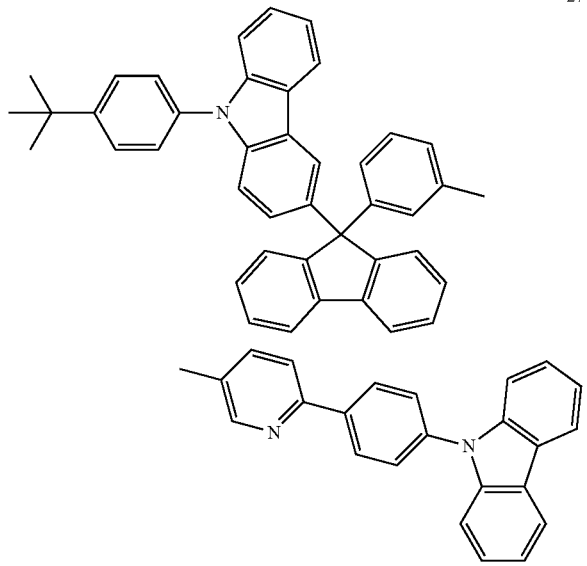
28
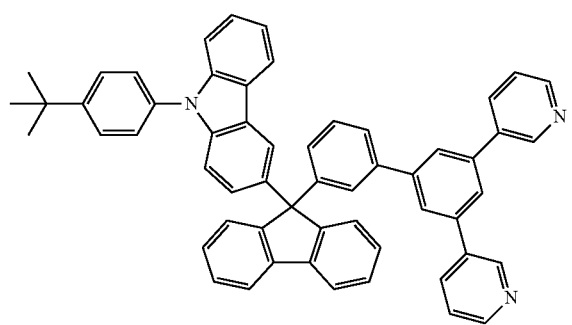
29
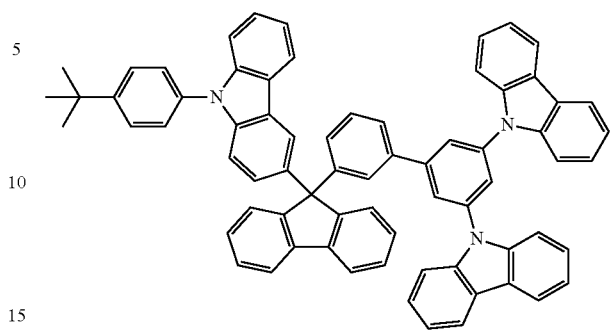
30
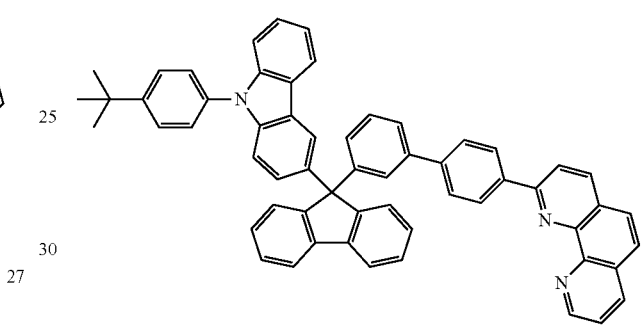
31
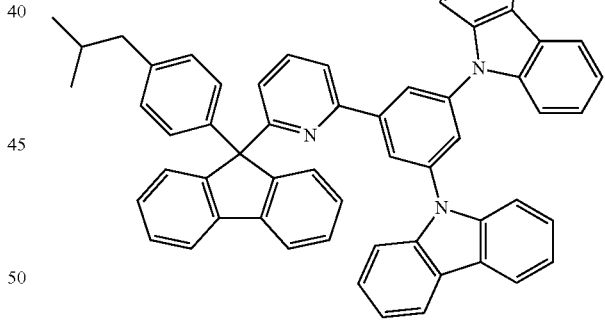
32
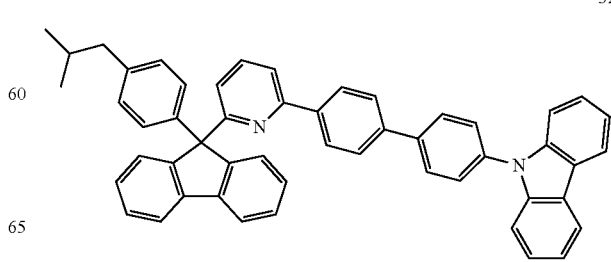

-continued
33
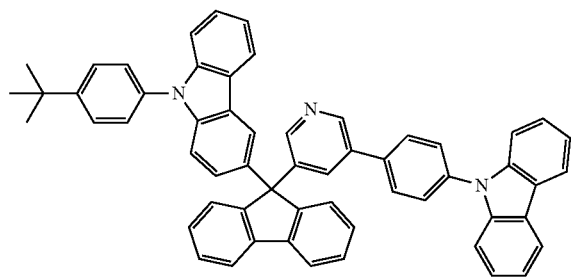
34
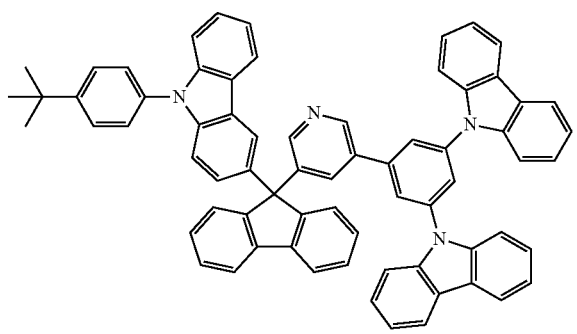
35
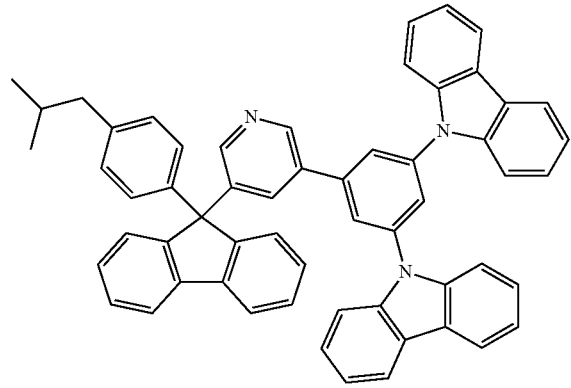
36
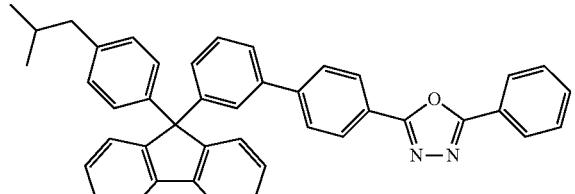
37
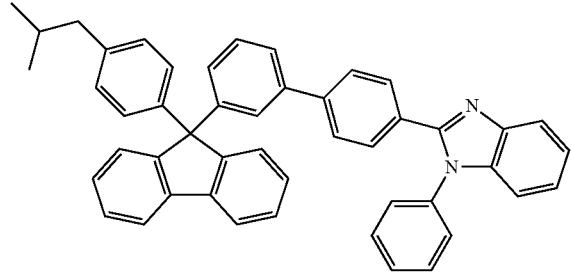
-continued
38
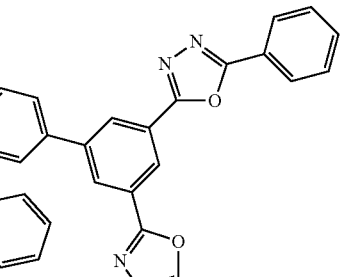
39
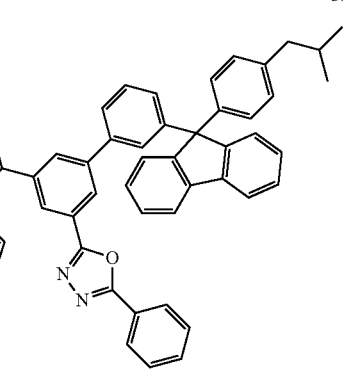
40
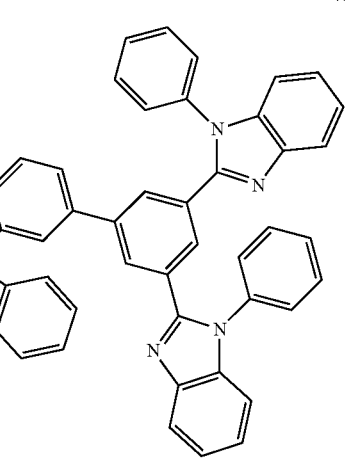
41
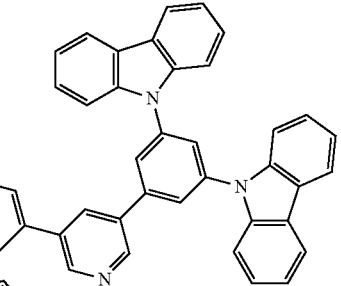

2. The material for an organic electro-optical device of claim 1, wherein the material is used as a host material with a dopant, and the dopant includes at least one of a red, green, blue, or white fluorescent or phosphorescent dopant.

3. An organic electro-optical device, comprising:

at least one layer of an organic thin layer interposed between an anode and a cathode, wherein the organic thin layer comprises the material according to one of claims 1 to 2.

4. The organic electro-optical device of claim 3, wherein the organic thin layer comprises:

an emission layer, and at least one layer selected from the group of a hole transport layer (HTL), a hole injection layer (HIL), an electron transport layer (ETL), an electron injection layer (EIL), and combinations thereof.

5. An organic electro-optical device, comprising:

a first electrode;

a second electrode; and a layer operably coupled to the first electrode and the second electrode, the layer including the material according to claim 1.

6. An organic light emitting diode comprising the material according to claim 1.

7. The material of claim 1, wherein the material includes the compound 2.

8. The material of claim 1, wherein the material includes the compound 3.

9. The material of claim 1, wherein the material includes the compound 8.

10. The material of claim 1, wherein the material includes the compound 9.

11. The material of claim 1, wherein the material includes the compound 41.

* * * * *